(12) United States Patent
Baggenstoss et al.

(10) Patent No.: US 7,229,724 B2
(45) Date of Patent: Jun. 12, 2007

(54) RETICLES AND METHODS OF FORMING AND USING THE SAME

(75) Inventors: William J. Baggenstoss, Boise, ID (US); Byron N. Burgess, Boise, ID (US); Erik Byers, Boise, ID (US); William A. Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 340 days.

(21) Appl. No.: 10/919,059

(22) Filed: Aug. 16, 2004

(65) Prior Publication Data

US 2005/0014078 A1 Jan. 20, 2005

Related U.S. Application Data

(62) Division of application No. 10/230,950, filed on Aug. 29, 2002, now Pat. No. 6,854,106.

(51) Int. Cl.
*G03F 1/00* (2006.01)
*G03C 5/00* (2006.01)
(52) U.S. Cl. .......................................... 430/5; 430/394
(58) Field of Classification Search .................. 430/5, 430/30, 311, 312, 394; 716/19
See application file for complete search history.

(56) References Cited

U.S. PATENT DOCUMENTS

| 5,258,920 | A | 11/1993 | Haller et al. |
| 5,429,896 | A | 7/1995 | Hasegawa et al. |
| 5,429,897 | A | 7/1995 | Yoshioka et al. |
| 5,446,521 | A | 8/1995 | Hainsey et al. |
| 5,707,765 | A | 1/1998 | Chen |
| 5,786,114 | A | 7/1998 | Hashimoto |
| 5,821,014 | A | 10/1998 | Chen et al. |
| 5,881,125 | A | 3/1999 | Dao |
| 6,255,024 | B1 | 7/2001 | Pierrat |
| 6,451,488 | B1 * | 9/2002 | Rhodes .......................... 430/5 |
| 6,667,791 | B2 | 12/2003 | Sanford et al. |
| 6,818,359 | B2 * | 11/2004 | Burgess et al. ................ 430/5 |
| 6,846,595 | B2 * | 1/2005 | Smith ............................ 430/5 |
| 2001/0005619 | A1 | 6/2001 | Hasebe et al. |
| 2002/0045106 | A1 * | 4/2002 | Baselmans et al. ............ 430/5 |
| 2002/0045136 | A1 | 4/2002 | Fritze et al. |

* cited by examiner

*Primary Examiner*—S. Rosasco
(74) *Attorney, Agent, or Firm*—Dinsmore & Shohl LLP

(57) ABSTRACT

Reticles having reticle patterns suitable for reducing edge of array effects are provided. The reticle patterns have unresolvable patterns formed in the periphery areas of the reticle patterns. The unresolvable patterns are non-transparent with respect to patterning radiation. Systems incorporating the reticles are also provided. Additionally, methods of forming and using the reticles are provided.

54 Claims, 3 Drawing Sheets

US 7,229,724 B2

RETICLES AND METHODS OF FORMING AND USING THE SAME

CROSS REFERENCE TO RELATED APPLICATIONS

This application is a division of U.S. patent application Ser. No. 10/230,950 filed Aug. 29, 2002 now U.S. Pat. No. 6,854,106.

BACKGROUND OF THE INVENTION

The present invention is directed toward reticles and methods of forming and employing the reticles.

Reticles are used in the semiconductor industry to form semiconductor devices having device features. There is a continuing effort to increase device density by scaling down device size, and state of the art devices currently have device features with dimensions well below one micron. Most reticles contain subarray areas containing the patterns for the memory features of the device. As the features size decreases, edge of array effects are observed. The edge of array effects are generally seen as critical dimension differences between the edge or corner of the subarray area and the subarray area a distance from the edge.

The edge of array effects may be caused by a number of factors. For example, process loading during the manufacture of a reticle may occur. Process loading during reticle manufacture may introduce error into the subarray area because the entire reticle pattern may contain dense and less dense or open areas. Similarly, process loading during wafer processing may occur that causes error to be introduced into the subarray area on the wafer. Stray light from less dense areas of a reticle can cause bulk exposure in a clear field reticle. Additionally, reticles may suffer from underexposure due to large dark areas of a dark field reticle to prevent underexposure.

The critical dimension difference has been addressed in a number of ways. For example, U.S. patent application Ser. No. 09/748,168 addresses the critical dimension difference by providing a process of manufacturing a photomask that includes forming a dummy pattern in less dense areas of the reticle and subsequently etching the dummy pattern away. The reticle provides improved critical dimension control. However, the reticle may not be easily inspected for defects and is process intensive.

Thus, there remains a need in the art for reticle patterns that address edge of array effects, and there remains a need in the art for methods of forming and using such reticle patterns.

SUMMARY OF THE INVENTION

The present invention relates to reticles and methods of forming and using reticles.

In accordance with one embodiment of the present invention, a reticle is provided, and the reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a sub-resolution pattern formed therein.

In accordance with another embodiment of the present invention, a system for patterning a radiation sensitive layer comprising a source of electromagnetic radiation and a reticle is provided. The reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a sub-resolution pattern formed therein.

In accordance with yet another embodiment of the present invention, a method of forming a reticle is provided. The method comprises providing a reticle blank and patterning the reticle blank to form a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a sub-resolution pattern formed therein.

In accordance with another embodiment of the present invention, a method of patterning a radiation sensitive layer is provided. The method comprises providing a reticle, and the reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a sub-resolution pattern formed therein. The method further comprises exposing a radiation sensitive layer with the reticle such that the radiation sensitive layer is exposed the reticle pattern. The densely patterned subarray features defining the at least one subarray area are patterned on the radiation sensitive layer in areas exposed to the at least one subarray area, and the radiation sensitive layer is not patterned in areas exposed to the sub-resolution pattern in the at least one periphery area.

In accordance with one embodiment of the present invention, a reticle is provided, and the reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a transmissive block fill formed therein.

In accordance with another embodiment of the present invention, a system for patterning a radiation sensitive layer comprising a source of electromagnetic radiation and a reticle is provided. The reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a transmissive block fill formed therein.

In accordance with yet another embodiment of the present invention, a method of forming a reticle is provided. The method comprises providing a reticle blank and patterning the reticle blank to form a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a transmissive block fill formed therein.

In accordance with another embodiment of the present invention, a method of patterning a radiation sensitive layer is provided. The method comprises providing a reticle, and the reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain a transmissive block fill formed therein. The method further comprises exposing a radiation sensitive layer with the reticle such that the radiation sensitive layer is exposed the reticle pattern. The densely patterned subarray features defining the at least one subarray area are patterned on the radiation sensitive layer in areas exposed to the at least one subarray area, and the radiation sensitive layer is not patterned in areas exposed to the transmissive block fill in the at least one periphery area.

In accordance with one embodiment of the present invention, a reticle is provided, and the reticle comprises a transparent reticle substrate having a reticle pattern. The reticle pattern comprises at least one subarray area defined by densely patterned subarray features and at least one periphery area defined by open areas. The open areas defining the at least one periphery area lie outside the at least one subarray area, and the open areas defining the at least one periphery area contain an unresolvable pattern formed therein.

DETAILED DESCRIPTION OF THE PREFERRED EMBODIMENTS

Figure 1A:
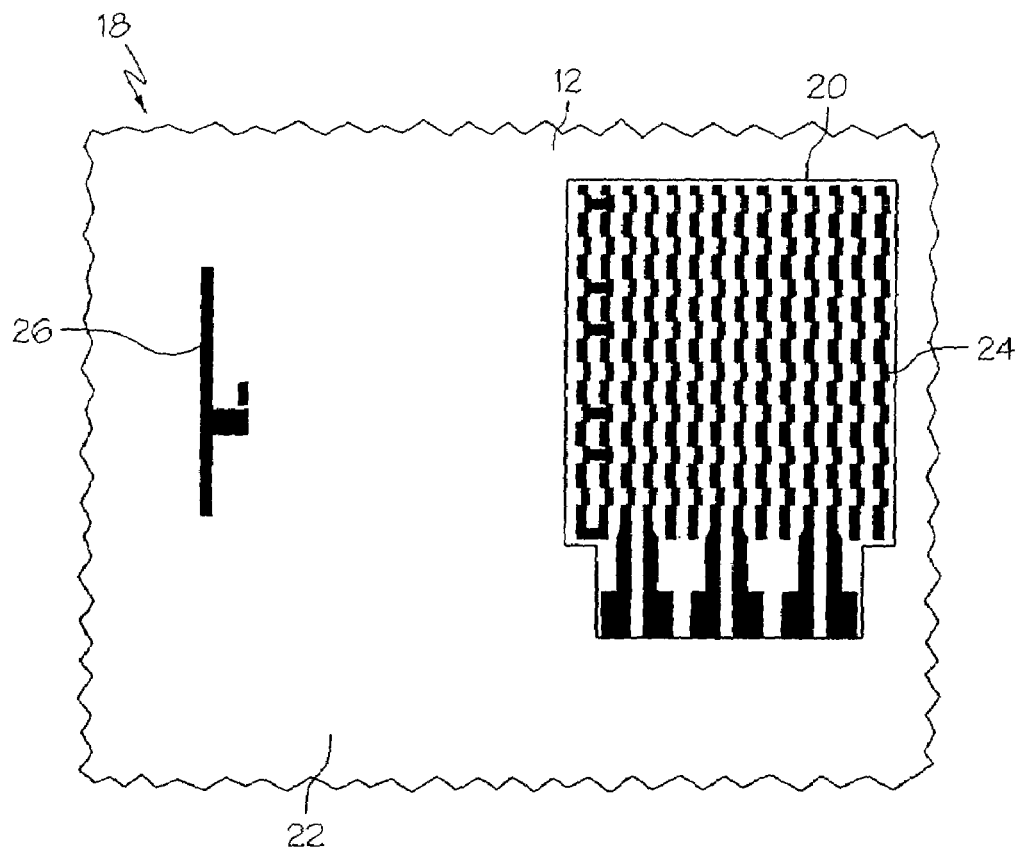
FIGS. 1a–1c are schematic illustrations of portions of reticles in accordance with the present invention.

The present invention provides reticles having reticle patterns that may address edge of array effects and methods of forming and using the same.

In the following detailed description, reference is made to the accompanying drawings that form a part hereof, and in which is shown by way of illustration, and not by way of limitation, specific embodiments in which the invention may be practiced. It is to be understood that other embodiments may be utilized and that changes may be made without departing from the spirit and scope of the present invention. In the drawings, like numerals describe substantially similar components throughout the several views.

Referring to FIG. 1a, a portion of a reticle 18 is illustrated schematically. The reticle 18 may be used to form patterns on radiation sensitive layers when the reticle is exposed to patterning radiation. The reticle 18 generally comprises a transparent reticle substrate 12 having a reticle pattern. The reticle pattern comprises at least one subarray area 20 and at least one periphery area 22. It will be understood by those having skill in the art that the reticle pattern generally has a plurality of subarray areas 20 and periphery areas 22 in a desired configuration, and that the reticle may be a clear field or dark field reticle. The subarray area 20 is defined by densely patterned subarray features 24. The densely patterned subarray features 24 are generally patterns for subarray components that are formed in a tightly packed configuration in the subarray area 20. The densely patterned subarray features 24 may have a space to feature ratio of between about 1:1 to about 4:1. For example, the densely patterned subarray features 24 may be feature patterns for capacitors or transistors that generally form portions of a memory of array.

The periphery area 22 is defined by open areas that lie outside the subarray area 20, and the open areas generally begin adjacent to the subarray area 20. The periphery area is defined by open areas because there are no densely patterned subarray features 24 in the open areas. However, the open areas defining the periphery area 22 may have feature patterns 26 formed in the open areas. The feature patterns 26 formed in the periphery area 22 are not formed near the subarray area 20. The feature patterns 26 may include, but are not limited to, feature patterns for sense amplifiers, row decoders, and row drivers.

Figure 1B:
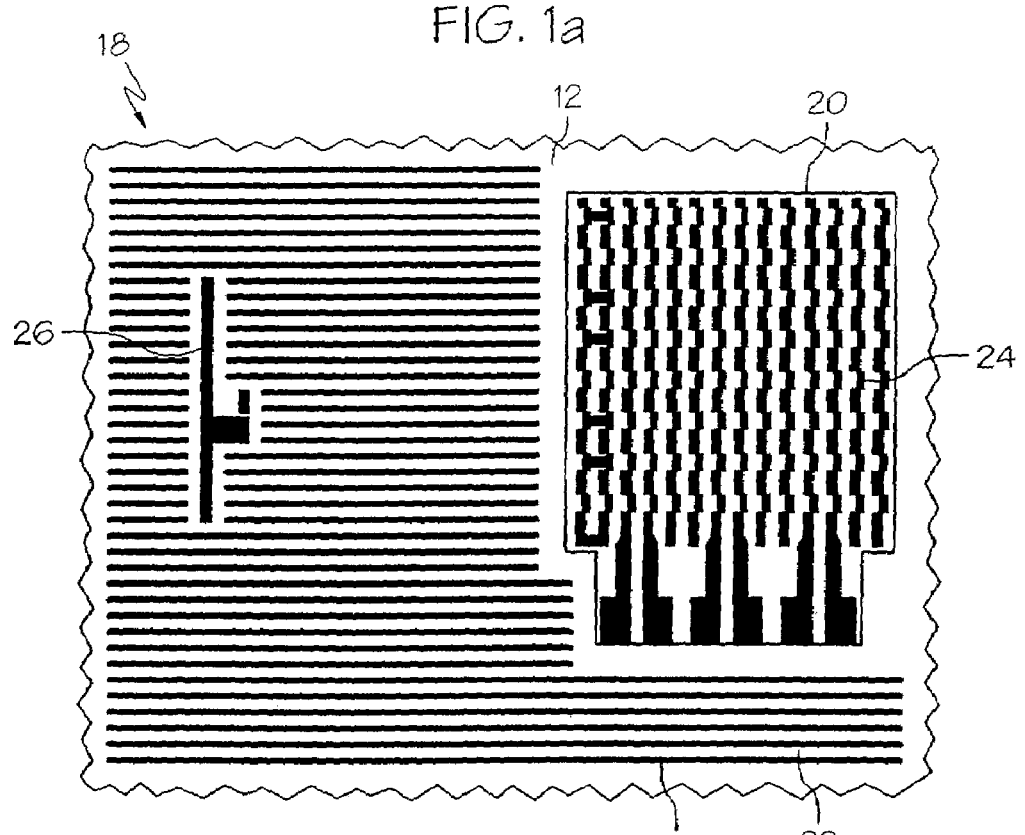

Referring to FIG. 1b, the open areas defining the periphery area 22 may contain a sub-resolution pattern 28 formed therein. As used herein, the term "sub-resolution pattern" is defined to mean a pattern dimensioned or configured such that the sub-resolution pattern will not print when the densely patterned subarray features will print on a radiation sensitive layer using a given printing system. For example, the resolution limit of a given process may be expressed mathematically by the following (Raleigh Criterion):

$$R=k_1(\lambda)/NA$$

where

R is the process resolution limit;

$k_1$ is the process capability factor;

$\lambda$ is the wavelength of the exposure source; and

NA is the numerical aperture of the lens for the exposure tool. Thus, the sub-resolution pattern 28 will generally be formed such that the features of the sub-resolution pattern 28 are below the R for the given process. The presence of the sub-resolution pattern 28 may address edge of array effects. For example, the presence of the sub-resolution pattern 28 may address stray light that can cause bulk exposure from less dense areas in a clear field reticle or increase the amount of light to prevent underexposure in a dark field reticle.

Figure 2A:
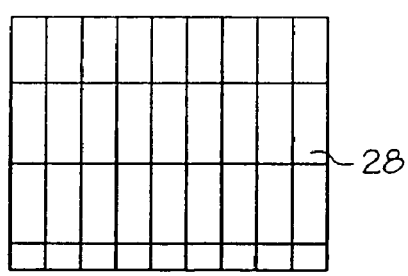
FIGS. 2a–2b are schematic illustrations of sub-resolution patterns.
Figure 2B:
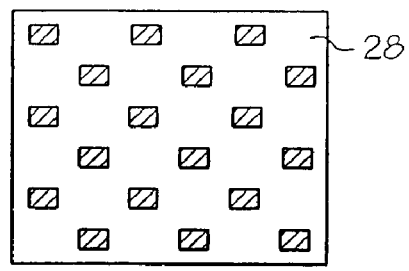

The sub-resolution pattern 28 may be a line pattern as shown in FIG. 1b. Alternatively, the sub-resolution pattern 28 may be a grid pattern as shown in FIG. 2a, a box pattern as shown in FIG. 2b, or any other suitable pattern that is sub-resolution in comparison to the densely patterned subarray features 24. The sub-resolution pattern is generally formed about 4 to about 40 μm from the subarray area 20, and the sub-resolution pattern is typically formed about 4 μm from the subarray area. The sub-resolution pattern 28 may be formed such that the pitch of the sub-resolution pattern 28 is approximately equal to the pitch of the densely patterned subarray features 24 defining the subarray area 20. When the pitch of the sub-resolution pattern 20 is approximately equal to the pitch of the densely patterned subarray features 24, the distance between the components of sub-resolution pattern 28 will be approximately equal to the distance between the densely patterned subarray features 24. Alternatively, the sub-resolution pattern 28 may be formed such that the density of the sub-resolution pattern 28 is approximately equal to the density of the densely patterned subarray features 24 defining the subarray area 20.

The sub-resolution pattern 28 may be formed such that the percentage of patterning radiation transmitted through the sub-resolution pattern 28 is approximately equal to the percentage of patterning radiation transmitted through the subarray area 20. For example, the sub-resolution pattern 28 may be formed such that about 25 to 50% of the patterning radiation incident on the sub-resolution pattern 28 is transmitted therethrough, and the sub-resolution pattern is more typically formed such that about 35% of the patterning radiation incident on the sub-resolution pattern 28 is transmitted therethrough.

Figure 1C:
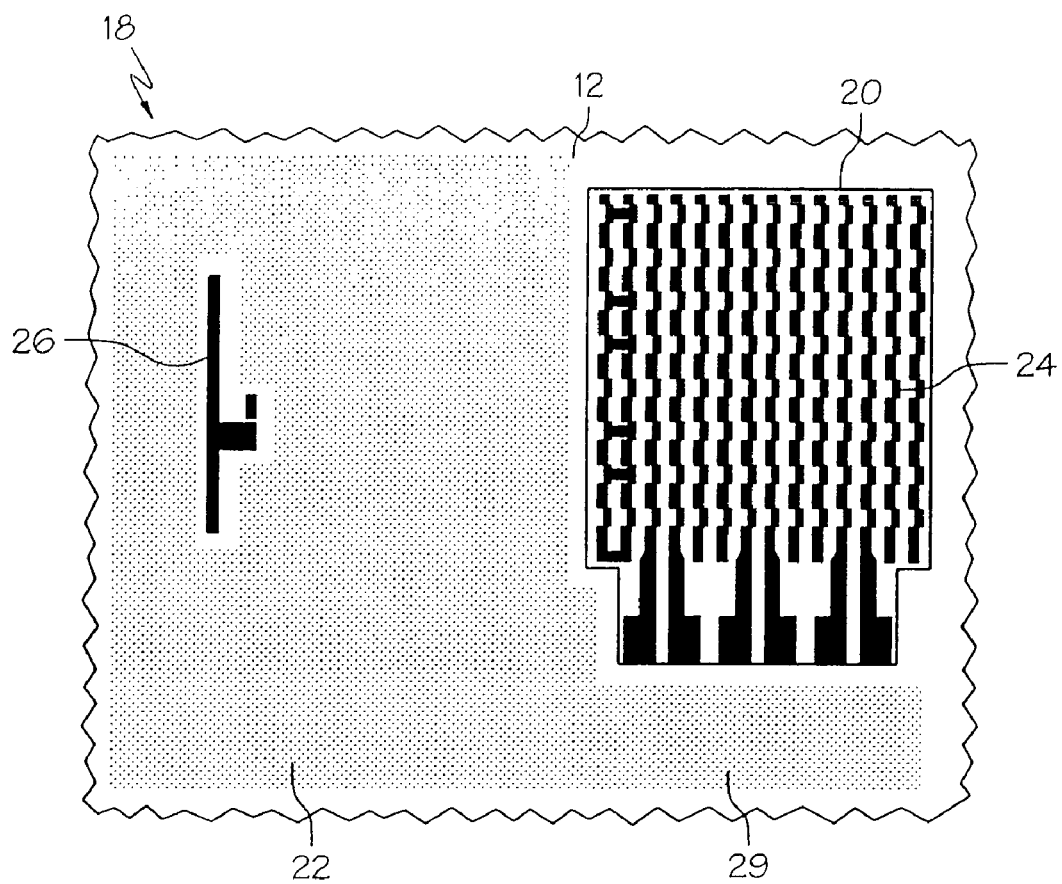

Referring to FIG. 1c, the open areas defining the periphery area 22 may alternatively contain a transmissive block fill 29 formed therein. The transmissive block fill 29 is formed to permit partial transmission of patterning radiation incident on the transmissive block fill 29. The presence of the transmissive block fill 29 may address edge of array effects.

The transmissive block fill 29 generally comprises a block fill that allows some patterning radiation to pass therethrough. The transmissive block fill 29 may be formed to permit transmission of an amount of patterning radiation that is the approximately equal to the percentage of patterning radiation transmitted through the subarray area 20. The transmissive block fill 29 may be formed such that the about 25% to about 50% of the patterning radiation incident on the transmissive block fill 29 is transmitted therethrough, and the transmissive block fill 29 is more typically formed such that the about 35% of the patterning radiation incident on the transmissive block fill 29 is transmitted therethrough. Generally, the transmissive block fill is formed about 4 to about 40 µm from the subarray area 20 on the reticle. The transmissive block fill 29 allows the reticle 18 to be more easily inspected for defects than if a sub-resolution pattern is present.

Referring to FIGS. 1b and 1c, the sub-resolution pattern 28 and the transmissive block fill 29 comprise unresolvable patterns. The patterns 28, 29 are unresolvable because presence of the sub-resolution pattern 28 or the transmissive block fill 29 on a reticle 18 does not cause a pattern corresponding to the sub-resolution pattern 28 or the transmissive block fill 29 to be formed at a given imaging point. For the purposes of defining and describing the present invention, it is noted that an imaging point is defined by a point, line, or plane at which an image of a subject pattern may be formed. For example, the imaging point may correspond to the focal point or focal plane of a given imaging system. The imaging point may also correspond to some point, line or plane displaced from the focal point or focal plane of a given imaging system, as long as a useful image of the subject pattern is formed at the displaced point or plane. It will be understood by those having skill in the art that other suitable unresolvable patterns may be employed in the periphery areas 22.

The periphery area 22 may contain areas having a sub-resolution pattern 28 and areas containing a transmissive block fill 29. Additionally, the reticle 18 may have a plurality of periphery areas 22, and some of the periphery areas 22 may have a sub-resolution pattern 28 while other periphery areas 22 have a transmissive block fill 29.

Figure 3:
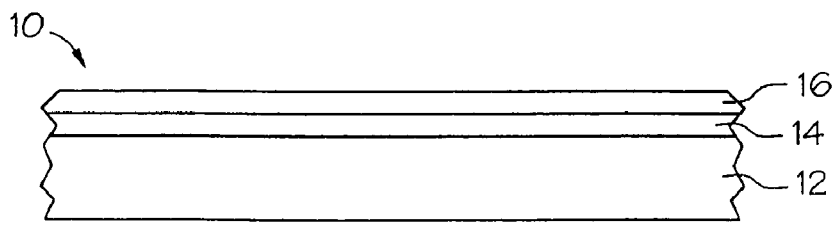
FIG. 3 is an illustration of a portion of a reticle blank.

FIG. 3 shows a portion of a reticle blank 10 that may be used in forming the reticles of the present invention. The reticle blank 10 has a transparent reticle substrate 12, a radiation blocking layer 14, and a resist layer 16. The transparent reticle substrate 12 may be formed from any suitable material such as quartz, and the transparent reticle substrate 12 may be of any suitable thickness and size. The radiation blocking layer 14 may be formed from one or more radiation blocking materials. For example, the radiation blocking layer 14 may be formed from chromium, molybdenum silicon, and combinations thereof. The resist layer 16 may be any suitable resist. It will be understood by those having skill in the art that other suitable reticle blanks and layer configurations may be used.

Referring to FIGS. 1b and 3, the reticle pattern comprising at least one subarray area 20 and at least one periphery area 22 having a sub-resolution pattern 28 may be formed using any suitable method. Generally, the desired reticle pattern is written onto the reticle blank 10. The reticle pattern may be written onto the reticle blank 10 using any suitable method. For example the reticle pattern may be written onto the reticle blank using an electron beam. Once the reticle pattern has been written on the reticle blank 18, the reticle blank 18 is developed and any exposed resist 16 is removed. Finally, the radiation blocking layer 14 is etched where the resist 16 has been removed, and the rest of the resist 16 is stripped. Therefore, the densely patterned subarray features 24 defining the subarray area 20, the sub-resolution pattern 28 in the open areas defining the periphery area 22, and the features 26 in the periphery area 22 are formed from at least one radiation blocking layer 14 on a transparent reticle substrate 12.

Referring to FIGS. 1c and 3, the reticle pattern comprising at least one subarray area 20 and at least one periphery area 22 having a transmissive block fill 29 may be formed using any suitable method. Generally, the desired reticle pattern is written onto the reticle blank 10. The reticle pattern may be written onto the reticle blank 10 using any suitable method. For example the reticle pattern may be written onto the reticle blank using an electron beam. The pattern may include block fill areas in the periphery 22 or the pattern may written to expose areas of the reticle substrate 12 in the periphery 22.

Once the reticle pattern has been written on the reticle blank 18, the reticle blank 18 is developed and any exposed resist 16 is removed. Finally, the radiation blocking layer 14 is etched where the resist 16 has been removed, and the rest of the resist 16 is stripped. In the case where the pattern includes block fill areas in the periphery 22, a subsequent resist layer is formed over the reticle and removed in areas containing the block fill 29, the block fill 29 is partially etched using any suitable method until the desired transmission or thickness is acheived, and the subsequent resist layer is then removed. In the case where the pattern has exposed areas of the reticle substrate 12 in the periphery, a transmissive radiation blocking layer may be formed over the exposed areas by any suitable method. Therefore, the densely patterned subarray features 24 defining the subarray area 20, the transmissive block fill 29 in the open areas defining the periphery area 22, and the features 26 in the periphery area 22 are formed from at least one radiation blocking layer 14 on a transparent reticle substrate 12.

Figure 4:
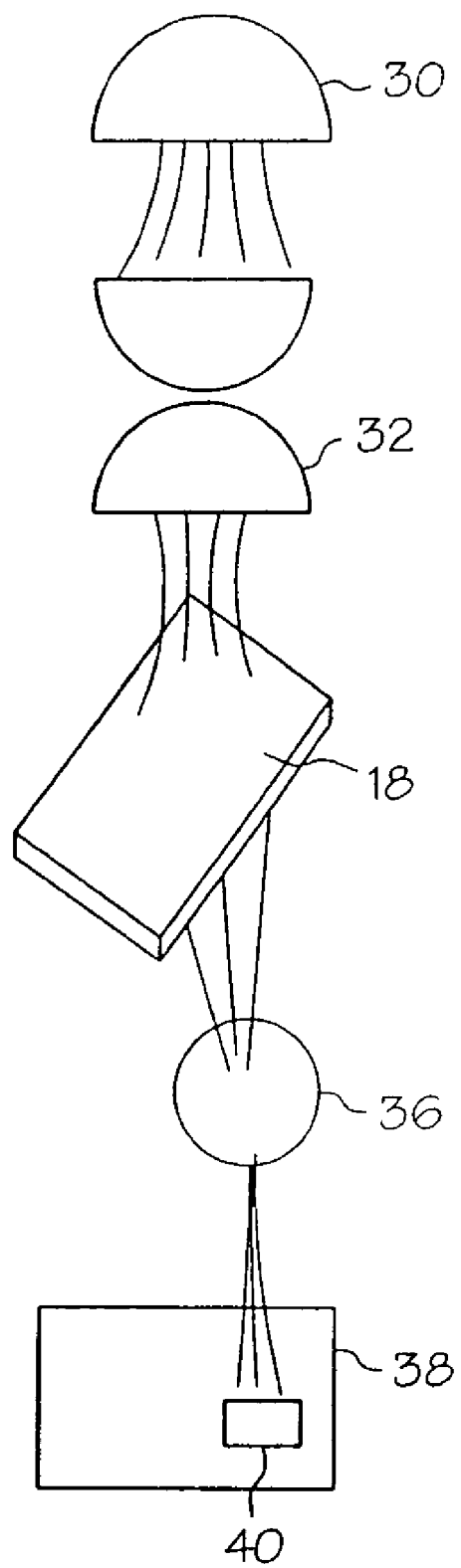
FIG. 4 is a schematic illustration of a reticle being used to pattern a radiation sensitive layer.

Referring to FIGS. 1b and 4, the reticle 18 having a sub-resolution pattern 28 may be used to pattern at least a portion of a radiation sensitive layer 38. Generally, the reticle 18 is positioned over at least a portion of a radiation sensitive layer 38. The radiation sensitive layer 38 is exposed with the reticle 18, and a pattern 40 is formed on the radiation sensitive layer 38. Generally, a radiation source 30 that produces patterning radiation is used to expose radiation sensitive layer 38 with the reticle 18, and the radiation source 30 is generally an electromagnetic radiation source. The reticle 18 may be used in conjunction with a lithographic printer, and a condenser 32 and reduction lens 36 may be used during the exposure of the radiation sensitive layer 38 to focus and reduce the reticle pattern onto the radiation sensitive layer 38. The reticle 18 may be used in a step and repeat system, a step and scan system, or any other suitable system.

Upon exposing the radiation sensitive layer 38 with the reticle 18, the pattern 40 on the radiation sensitive layer 38 comprises the densely patterned subarray features 24 defining the subarray area 20 in areas exposed to the subarray area 20. The radiation sensitive layer 38 is not patterned in areas exposed to the sub-resolution pattern 28 in the periphery area 22. However, pattern 40 further comprises patterns in areas of the radiation sensitive layer 38 exposed to the feature patterns 26 in the periphery area 22. The use of the reticle 18 having a sub-resolution pattern 28 may address edge of array effects. The radiation sensitive layer 38 may be a part of a semiconductor substrate. As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials.

Referring to FIGS. 1c and 4, the reticle 18 having a transmissive block fill 29 may be used to pattern at least a portion of a radiation sensitive layer 38. Generally, the reticle 18 is positioned over at least a portion of a radiation sensitive layer 38. The radiation sensitive layer 38 is exposed with the reticle 18, and a pattern 40 is formed on the radiation sensitive layer 38. A radiation source 30 that produces patterning radiation is used to expose radiation sensitive layer 38 with the reticle 18, and the radiation source 30 is generally an electromagnetic radiation source. The reticle 18 may be used in conjunction with a lithographic printer, and a condenser 32 and reduction lens 36 may be used during the exposure of the radiation sensitive layer 38 to focus and reduce the reticle pattern onto the radiation sensitive layer 38. The reticle 18 may be used in a step and repeat system, a step and scan system, or any other suitable system.

Upon exposing the radiation sensitive layer 38 with the reticle 18, the pattern 40 on the radiation sensitive layer 38 comprises the densely patterned subarray features 24 defining the subarray area 20 in areas exposed to the subarray area 20. The radiation sensitive layer 38 is not patterned in areas exposed to the transmissive block fill 29 in the periphery area 22. However, pattern 40 further comprises patterns in areas of the radiation sensitive layer 38 exposed to the feature patterns 26 in the periphery area 22. The use of the reticle 18 having a transmissive block fill 29 may reduce edge of array effects. The radiation sensitive layer 38 may be a part of a semiconductor substrate.

It will be obvious to those skilled in the art that various changes may be made without departing from the scope of the invention, which is not to be considered limited to what is described in the specification. It shall be observed that the present invention can be practiced in conjunction with a variety of integrated circuit fabrication and reticle fabrication techniques, including those techniques currently used in the art and any other suitable, yet to be developed techniques. Additionally, it is contemplated that the reticle designs disclosed herein are not limited to applications where edge of array effects are addressed.

What is claimed is:

1. A reticle for use with patterning radiation comprising:
    a substrate that is transparent with respect to the patterning radiation incident thereon, said substrate having a reticle pattern that comprises at least one subarray area, and at least one periphery area defined by open areas that lie outside said at least one subarray area, said open areas contain an unresolvable pattern formed therein, said unresolvable pattern is non-transparent with respect to the patterning radiation and does not cause a corresponding pattern to be formed at a given image point.

2. The reticle as claimed in claim 1 wherein said reticle pattern further comprises densely patterned subarray features formed in said at least one subarray area.

3. The reticle as claimed in claim 1 wherein said unresolvable pattern comprises a transmissive block fill, a partially etched block fill, a sub-resolution pattern, and combinations thereof.

4. The reticle as claimed in claim 1 wherein said at least one subarray area comprises densely patterned subarray features, and said unresolvable pattern is selected from a transmissive block fill, a partially etched block fill, a sub-resolution pattern, and combinations thereof.

5. The reticle as claimed in claim 1 wherein said unresolvable pattern is a transmissive block fill formed to permit partial transmission of the patterning radiation incident on said transmissive block fill.

6. The reticle as claimed in claim 1 wherein said unresolvable pattern comprises a radiation blocking layer.

7. The reticle as claimed in claim 1 wherein said unresolvable pattern comprises a molybdenum silicon layer, a chromium layer, and combinations thereof.

8. The reticle as claimed in claim 1 wherein said unresolvable pattern is formed about 8 to about 40 ÿm from said at least one subarray area.

9. The reticle as claimed in claim 1 wherein said at least one subarray area comprises densely patterned subarray features having a space to feature ratio of between 1:1 to about 4:1.

10. The reticle as claimed in claim 1 wherein said unresolvable pattern is formed to permit about 25 to about 50% of the patterning radiation incident on said unresolvable pattern to be transmitted therethrough.

11. The reticle as claimed in claim 1 wherein said unresolvable pattern is formed to permit transmission of an amount of the patterning radiation approximately equal to the percentage of the patterning radiation transmitted through said at least one subarray area.

12. The reticle as claimed in claim 1 wherein said unresolvable pattern is formed such that only a portion of the patterning radiation incident on said sub-resolution pattern is transmitted therethrough.

13. A reticle as claimed in claim 1 wherein said reticle pattern further comprises densely patterned subarray features formed in said at least one subarray area, said densely patterned subarray features comprise feature patterns for forming portions of a memory array.

14. The reticle as claimed in claim 1 wherein said unresolvable pattern is a sub-resolution pattern comprising a grid pattern, a line pattern, a box pattern, any other suitable pattern that is sub-resolution in comparison to said at least one subarray area, and combinations thereof.

15. The reticle as claimed in claim 1 wherein said unresolvable pattern is a sub-resolution pattern that is formed about 4 to about 40 ÿm from said at least one subarray area.

16. The reticle as claimed in claim 1 wherein said at least one subarray area comprises densely patterned subarray features, and said unresolvable pattern is formed such that density of said unresolvable pattern is approximately equal to the density of said patterned subarray features defining said at least one subarray area.

17. The reticle as claimed in claim 1 wherein said at least one subarray area comprises densely patterned subarray features, and said unresolvable pattern is formed such that pitch of said unresolvable pattern is approximately equal to the pitch of said patterned subarray features defining said at least one subarray area.

18. The reticle as claimed in claim 1 wherein said at least one subarray area comprises densely patterned subarray features, and said unresolvable pattern is formed such that pitch of said unresolvable pattern is approximately equal to the pitch of said patterned subarray features defining said at least one subarray area, wherein a distance between features of said unresolvable pattern is approximately equal to the distance between features of said densely patterned subarray features.

19. A method of forming a reticle as claimed in claim 1 comprising:
providing said substrate as a reticle blank; and
patterning said reticle blank to form said reticle pattern.

20. The method of forming a reticle as claimed in claim 19 wherein said reticle pattern further comprises densely patterned subarray features formed in said at least one subarray area.

21. The method of forming a reticle as claimed in claim 19 wherein said unresolvable pattern comprises a transmissive block fill, a partially etched block fill, a sub-resolution pattern, and combinations thereof.

22. The method of forming a reticle as claimed in claim 19 wherein said at least one subarray area comprises densely patterned subarray features, and said unresolvable pattern comprises a transmissive block fill, a partially etched block fill, a sub-resolution pattern, and combinations thereof.

23. The method of forming a reticle as claimed in claim 19 wherein said unresolvable pattern is a transmissive block fill formed to permit partial transmission of the patterning radiation incident on said transmissive block fill.

24. The method of forming a reticle as claimed in claim 19 wherein said unresolvable pattern comprises a radiation blocking layer.

25. The method of forming a reticle as claimed in claim 19 wherein said unresolvable pattern comprises a molybdenum silicon layer, a chromium layer, and combinations thereof.

26. The method of forming a reticle as claimed in claim 19 wherein said unresolvable pattern is formed about 8 to about 40 μm from said at least one subarray area.

27. The method of forming a reticle as claimed in claim 19 wherein said at least one subarray area comprises densely patterned subarray features having a space to feature ratio of between 1:1 to about 4:1.

28. The method of forming a reticle as claimed in claim 19 wherein said unresolvable pattern is formed to permit about 25 to about 50% of the patterning radiation incident on said unresolvable pattern to be transmitted therethrough.

29. The method of forming a reticle as claimed in claim 19 wherein said unresolvable pattern is formed to permit transmission of an amount of the patterning radiation approximately equal to the percentage of the patterning radiation transmitted through said at least one subarray area.

30. The method of forming a reticle as claimed in claim 19 wherein said unresolvable pattern is formed such that only a portion of the patterning radiation incident on said sub-resolution pattern is transmitted therethrough.

31. The method of forming a reticle as claimed in claim 19 wherein said reticle pattern further comprises densely patterned subarray features formed in said at least one subarray area, said densely patterned subarray features comprise feature patterns for forming portions of a memory array.

32. The method of forming a reticle as claimed in claim 19 wherein said unresolvable pattern is a sub-resolution pattern comprising a grid pattern, a line pattern, a box pattern, any other suitable pattern that is sub-resolution in comparison to said at least one subarray area, and combinations thereof.

33. The method of forming a reticle as claimed in claim 19 wherein said unresolvable pattern is a sub-resolution pattern that is formed about 4 to about 40 μm from said at least one subarray area.

34. The method of forming a reticle as claimed in claim 19 wherein said at least one subarray area comprises densely patterned subarray features, and said unresolvable pattern is formed such that the density of said unresolvable pattern is approximately equal to the density of said patterned subarray features defining said at least one subarray area.

35. The method of forming a reticle as claimed in claim 19 wherein said at least one subarray area comprises densely patterned subarray features, and said unresolvable pattern is formed such that the pitch of said unresolvable pattern is approximately equal to the pitch of said patterned subarray features defining said at least one subarray area.

36. The method of forming a reticle as claimed in claim 19 wherein said at least one subarray area comprises densely patterned subarray features, and said unresolvable pattern is formed such that pitch of said unresolvable pattern is approximately equal to the pitch of said patterned subarray features defining said at least one subarray area, wherein a distance between features of said unresolvable pattern is approximately equal to the distance between features of said densely patterned subarray features.

37. A method of patterning a radiation sensitive layer using a reticle as claimed in claim 1 comprising:
providing said reticle; and
exposing the radiation sensitive layer with radiation incident on and passing through said reticle such that said radiation sensitive layer is exposed to said reticle pattern, wherein:
said at least one subarray area is patterned on said radiation sensitive layer in areas exposed to said at least one subarray area; and
said radiation sensitive layer is not patterned in areas exposed to said unresolvable pattern in said at least one periphery area.

38. The method of forming a reticle as claimed in claim 37 wherein said reticle pattern further comprises densely patterned subarray features formed in said at least one subarray area.

39. The method of forming a reticle as claimed in claim 37 wherein said unresolvable pattern comprises a transmissive block fill, a partially etched block fill, a sub-resolution pattern, and combinations thereof.

40. The method of forming a reticle as claimed in claim 37 wherein said at least one subarray area comprises densely patterned subarray features, and said unresolvable pattern comprises a transmissive block fill, a partially etched block fill, a sub-resolution pattern, and combinations thereof.

41. The method of forming a reticle as claimed in claim 37 wherein said unresolvable pattern is a transmissive block fill formed to permit partial transmission of the patterning radiation incident on said transmissive block fill.

42. The method of forming a reticle as claimed in claim 37 wherein said unresolvable pattern comprises a radiation blocking layer.

43. The method of forming a reticle as claimed in claim 37 wherein said unresolvable pattern comprises a molybdenum silicon layer, a chromium layer, and combinations thereof.

44. The method of forming a reticle as claimed in claim 37 wherein said unresolvable pattern is formed about 8 to about 40 ÿm from said at least one subarray area.

45. The method of forming a reticle as claimed in claim 37 wherein said at least one subarray area comprises densely patterned subarray features having a space to feature ratio of between 1:1 to about 4:1.

46. The method of forming a reticle as claimed in claim 37 wherein said unresolvable pattern is formed to permit about 25 to about 50% of the patterning radiation incident on said unresolvable pattern to be transmitted therethrough.

47. The method of forming a reticle as claimed in claim 37 wherein said unresolvable pattern is formed to permit transmission of an amount of the patterning radiation approximately equal to the percentage of the patterning radiation transmitted through said at least one subarray area.

48. The method of forming a reticle as claimed in claim 37 wherein said unresolvable pattern is formed such that only a portion of the patterning radiation incident on said sub-resolution pattern is transmitted therethrough.

49. The method of forming a reticle as claimed in claim 37 wherein said reticle pattern further comprises densely patterned subarray features formed in said at least one subarray area, said densely patterned subarray features comprise feature patterns for forming portions of a memory array.

50. The method of forming a reticle as claimed in claim 37 wherein said unresolvable pattern is a sub-resolution pattern comprising a grid pattern, a line pattern, a box pattern, any other suitable pattern that is sub-resolution in comparison to said at least one subarray area, and combinations thereof.

51. The method of forming a reticle as claimed in claim 37 wherein said unresolvable pattern is a sub-resolution pattern that is formed about 4 to about 40 µm from said at least one subarray area.

52. The method of forming a reticle as claimed in claim 37 wherein said at least one subarray area comprises densely patterned subarray features, and said unresolvable pattern is formed such that the density of said unresolvable pattern is approximately equal to the density of said patterned subarray features defining said at least one subarray area.

53. The method of forming a reticle as claimed in claim 37 wherein said at least one subarray area comprises densely patterned subarray features, and said unresolvable pattern is formed such that the pitch of said unresolvable pattern is approximately equal to the pitch of said patterned subarray features defining said at least one subarray area.

54. The method of forming a reticle as claimed in claim 37 wherein said at least one subarray area comprises densely patterned subarray features, and said unresolvable pattern is formed such that pitch of said unresolvable pattern is approximately equal to the pitch of said patterned subarray features defining said at least one subarray area, wherein a distance between features of said unresolvable pattern is approximately equal to the distance between features of said densely patterned subarray features.

* * * * *

UNITED STATES PATENT AND TRADEMARK OFFICE
CERTIFICATE OF CORRECTION

PATENT NO. : 7,229,724 B2 Page 1 of 1
APPLICATION NO. : 10/919059
DATED : June 12, 2007
INVENTOR(S) : Baggenstoss et al.

It is certified that error appears in the above-identified patent and that said Letters Patent is hereby corrected as shown below:

In column 8, line 31, in Claim 8, delete "ÿm" and insert -- µm --, therefor.

In column 8, line 62, in Claim 15, delete "ÿm" and insert -- µm --, therefor.

In column 11, line 10, in Claim 44, delete "ÿm" and insert -- µm --, therefor.

Signed and Sealed this

Thirteenth Day of November, 2007

JON W. DUDAS
*Director of the United States Patent and Trademark Office*